Jan. 10, 1950 A. G. TYNAN ET AL 2,494,017

ELECTRONICALLY CONTROLLED TUNING MEANS

Filed April 22, 1949

Inventors
Andrew G. Tynan &
James H. Guyton

By

Spencer, Willits, Helwig & Baillio
Attorneys

Patented Jan. 10, 1950 2,494,017

UNITED STATES PATENT OFFICE 2,494,017

ELECTRONICALLY CONTROLLED TUNING MEANS

Andrew G. Tynan and James H. Guyton, Kokomo, Ind., assignors to General Motors Corporation, Detroit, Mich., a corporation of Delaware Application April 22, 1949, Serial No. 89,132

7 Claims. (Cl. 250—40)

This invention relates to means for tuning a radio receiver over a predetermined band of frequencies and more particularly to means for automatically scanning a frequency band and indexing or stopping the tuner on a given station through a control voltage provided by the incoming signal. This type of signal control tuner is not new in general but the previously known types have had certain disadvantages which it is desired to overcome.

One of these has been what might be referred to as coasting by or overtraveling, causing stopping off station where the incoming signal for control purposes is weak or near the threshold of operativeness and impulses applied to stop the tuner may be insufficient to cause it to stop immediately or within a predetermined period and it therefore coasts beyond the station or to the far side thereof before it stops, and as a result gives poor reception. In such instances it would be far better to have the tuner proceed to the next station rather than stop at all.

Many of the previous tuners of this type have required an excessive amount of current due to the fact that the control relay was energized at all times except when the tuning means was in operation which, of course, is a relatively short time.

Lastly, many of these tuners required an interlocking switch to prevent operation during the warm-up period.

It is, therefore, an object of our invention to provide a signal actuated tuner that will proceed to the next station if it coasts through one due to weak control signals.

It is a further object of our invention to provide a signal actuated tuner that will skip a station unless it stops within a predetermined set of limits.

It is a still further object of our invention to provide a tuner which is economical from a current drain standpoint.

It is a still further object of our invention to provide a signal actuated tuner that does not require special interlocking means to prevent operation during warm-up.

Figure 1:
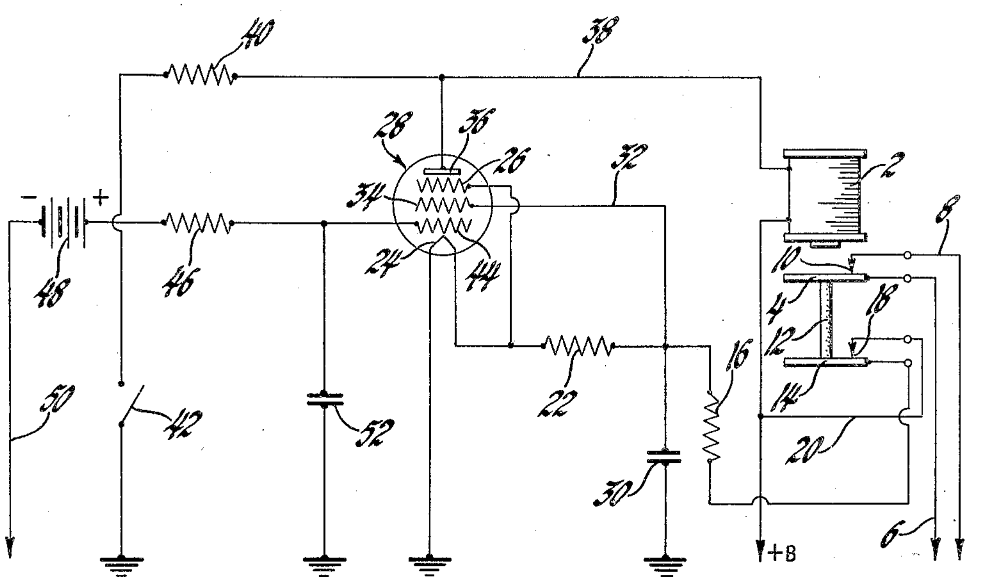
Figure 2:
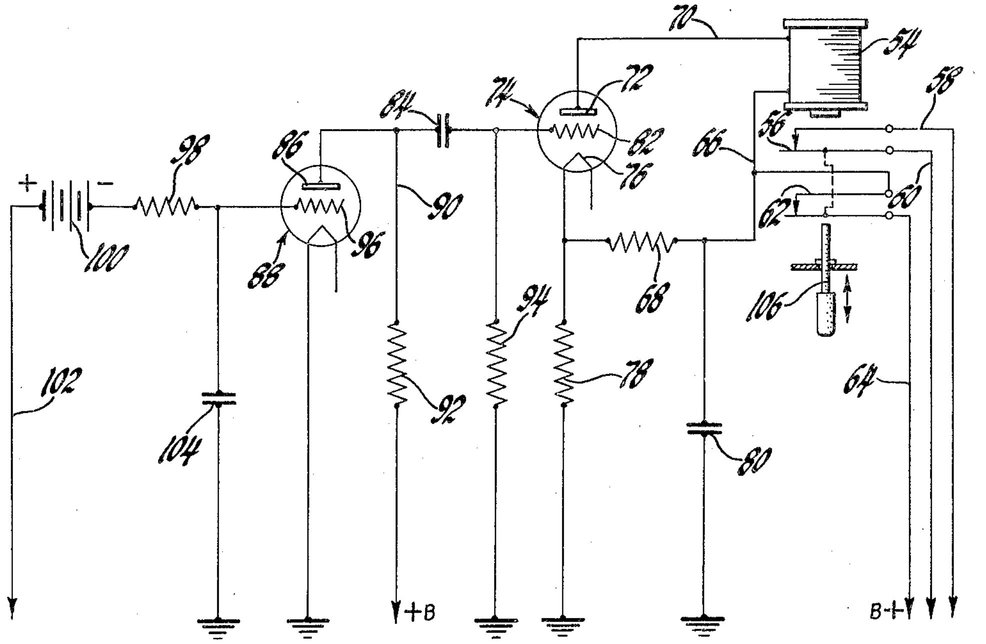

With the above and other objects in view, our invention may be best understood by reference to the following specification and claims and the illustrations in the accompanying drawing, in which:

Figure 1 is a circuit diagram of a control circuit for a signal actuated tuner embodying our invention; and Figure 2 is a circuit diagram of a control circuit embodying a modified form of our invention.

Referring now more specifically to the drawings, it is desired to mention that the control circuits set forth therein are intended to be used with the conventional radio receiver in which automatic volume control is provided. Various means for volume control have, of course, in the past been used but it is conventional to feed back from the detector a negative voltage which reduces the system gain ahead of the detector, and, therefore, tends to counteract changes therein and assists in maintaining the average output substantially constant. These lines or circuits in receivers are called the AVC lines and it is from this line that we obtain our control impulse.

Referring now more specifically to Figure 1, there is shown therein a control relay 2 which operates the switching means for the tuning motor for scanning the desired band. Armature 4 actuated by the relay is connected to the main motor circuit lines 6 and 8, line 6 being directly connected to armature 4, the latter cooperating with a stationary contact 10 for switch purposes. An insulating member 12 mechanically connects armature 4 with a second spaced armature 14 which moves therewith, the latter being connected directly to resistor 16 and being able to mechanically engage a fixed contact 18, which is conductively connected to line 20. Resistor 16 is connected to one end of a resistor 22, the opposite end of which is in turn connected to cathode 24 and grid 26 of the control tube 28, the cathode, of course, likewise being grounded on the opposite side.

A capacitor 30 is connected between resistor 16 and ground and resistor 16 is directly connected through line 32 to screen grid 34 of the tube. Plate 36 of the tube is directly connected through line 38 to the relay 2, the opposite side of which is connected to a source of voltage, B+. Line 20 is also connected to B+ as is obvious. Plate 36 is likewise connected to resistor 40, the opposite terminal of which proceeds to a manually operated swtch 42 and thence to ground. Control grid 44 of the tube is connected through resistor 46 to the positive terminal of a biasing battery 48, the negative side of which is connected through line 50 to the AVC line of the receiver previously mentioned. A condenser 52 is connected between control grid 44 and ground.

When the receiver is turned on and ready to receive stations, the relay 2 will be energized through the circuit from B+, relay 2, line 38, plate 36 and cathode 24. The energization of the relay 2, of course, closes the motor circuit through switch 4—10, and the set is continuously tuned across a given band until a station of predetermined strength is intercepted. At that time a pulse or relatively large increase in the negative voltage appearing in line 50 occurs to overcome the biasing battery 48 and drives the grid 44 of the tube 28 negative to cause it to cut off, which causes deenergization of the relay 2 and an opening of the motor circuit.

However, in order to overcome the difficulty of stopping off station as previously explained, there is provided a delay circuit which consists of the capacitor 30 and the resistance 22 and prevents immediate removal of screen voltage and hence prevents loss of relay control by the tube for a predetermined time, inasmuch as the capacitor 30 discharges through the screen grid 34, circuit of the tube and the resistor 22, and maintains screen voltage for a short time. If, prior to the end of this discharge time, the voltage in the line 50 has disappeared or been substantially reduced, the tube will again be restored to conductive condition and the relay will pick up after being dropped a short time and the station will be skipped and the tuner will proceed to the next strong station, which will avoid any detuning or off station stopping where the signal is not of sufficient strength to cause the tuner to stop with the desired rapidity. When capacitor 30 has been completely discharged and the AVC signal still exists, the plate current of the tube cannot rise to a value sufficiently high to cause the relay to close until such time as the manual switch 42 is closed, which places on the relay and resistance 40 in series the full B+ voltage and permits the tuner to move on to the next desired station. The determination of the values of capacitor 30 and resistor 22 should be of sufficient value so that the screen voltage remains high long enough to permit station skipping.

In this embodiment of our invention it will be obvious through the use of a minimum number of parts we have provided a control circuit in which the relay is only energized during tuning cycles, and therefore no interlock is necessary during warm-up period, in which only a single additional tube is used for the control, and also one in which, if the device tends to overtravel or skip due to overtravel on weak signals, it proceeds to the next station rather than stop off to one side of the resonance peak, and give poor reception.

Referring now more specifically to the modification shown in Figure 2, a control relay 54 is disclosed therein which operates a first switch 56 in the main motor lines 58, 60, and at the same time simultaneously operates a switch 62 in B+ power supply line 64. Switch 62 is directly connected to line 66 which extends from control resistor 68 to one terminal of the control relay 54, the opposite terminal of said relay being connected through line 70 to plate 72 of control tube 74. Resistor 68 is connected to cathode 76 of the tube 74 and likewise to one end of resistor 78, the opposite terminal of which is grounded. Capacitor 80 is connected between line 66 and ground. Control grid 82 of the tube 74 is connected through condenser 84 to the plate 86 of a second thermionic tube 88. Plate 86 is in turn connected through line 90 and resistor 92 to B+ supply and grid 82 is connected to resistor 94, the opposite terminal of resistor being grounded. Control grid 96 of tube 88 is connected to resistor 98 and thence through biasing battery 100 to conductor 102, which is as in the previous case, line 50, was connected to the AVC control voltage, which must now have a positive polarity with respect to ground. A condenser 104 is connected between the control grid 96 and ground.

Again in this case relay 54 is intended to be energized only at such times as the set is being tuned, and it will be obvious that upon energization of said relay, the motor circuit 58—60 is closed, as is the B+ supply which is connected to line 64. These switches 56 and 62, which operate together, may be manually closed by any suitable mechanical means such as push button 106, which then moves back out of the way so that the switches may open upon deenergization of the coil 54.

Assuming now that the set has been turned on for a sufficient length of time to enable the tubes to warm up so that they may properly conduct, the operator forces push button 106 inwardly to close the compound switch 56—62. This closes the tuning motor circuit 58—60 and the tuning motor operates to cause the set to scan the band. The closure of switch 62 completes a circuit to the relay coil 54 as follows: B+ power supply, line 64, switch 62, line 66, relay coil 54, line 70, tube 74, resistance 78 to ground. Push button 106 moves back out of the way as soon as released and relay coil 54 maintains the switches closed as long as it remains energized. The motor continues the scanning operation until a signal having sufficient strength for operation is received, and this signal causes a positive voltage to appear in line 102, which is proportional to the AVC voltage. To this point tube 88 has been nonconducting, since it is biased beyond cut-off by battery 100. Either a positive or a negative pulse may be obtained from the receiver to trigger the circuit and in this case it is assumed that a positive pulse is provided.

This positive pulse overcomes the bias of battery 100 and permits tube 88 to conduct. When the tube conducts, it of course draws plate current and condenser 84 discharges through resistance 94, tube 88 and resistance 92 due to the drop in voltage on plate 86. This produces a negative bias on grid 82 and causes this tube 74 to become non-conducting and if the signal for triggering is sufficiently strong, the relay 54 will be deenergized and drop its switches 56 and 62 to stop the set on that station. However, if the signal is weak or if the motor stopping mechanism operates too slowly so that the motor stops too late to stop on station and there would be overtravel, there is provided a condenser 80 which is charged by the B+ voltage during the scanning operation and which, for a short time interval after grid 82 has received a negative bias, provides through its discharge current means to maintain the relay 54 in energized condition. If at the end of this period the tube 74 is still non-conducting, the relay will drop and the station will be in tune. If, however, the signal was weak and the tuner travelled past the station, then the bias on grid 82 would have disappeared and the tube would again be conductive to still maintain the relay 54 energized and the tuner would pass on to the next station. To assure positive stopping on stations which are tuned accurately, condenser 84 must hold its charge longer than condenser 80. The time constants of these individual circuits (84, 94, 92 and tube 88 in one case and 80, 68 and 78 in the second case) must be so balanced.

In this form of our invention the relay is only energized when the set is tuning, no interlock is necessary to prevent operation during the warm-up period, and upon weak signals the tuner will pass on to the next strong station rather than stop to one side of the resonant tune point.

We claim:

1. In high frequency signalling apparatus having power actuated tuning means to repetitively scan the frequency band of the apparatus and stop or index due to an incoming signal, means for controlling the power actuated tuner including relay switching means connected to and controlling the power actuated means, a multi-electrode tube having input and output circuits, the output circuit being connected to the relay, a source of power being connected in series with the relay and the output circuit of the tube so that when the latter conducts the relay will be energized to close the circuit to the power actuated tuning means, a control electrode in said input circuit to said tube, conductive means upon which a voltage is developed which is proportional to the strength of the incoming signal connected to the control electrode to control conductive periods of said tube and therefore energizing periods of the relay and electrical storage means connected to the output circuit of the tube to furnish energizing power to the relay for a short predetermined time after tube deenergization by the incoming signal to provide delay after the tube has been biased to cut off.

2. In high frequency signalling apparatus having power actuated tuning means to repetitively scan the frequency band of the apparatus and stop or index due to an incoming signal, means for controlling the power actuated tuner including relay switching means connected to and controlling the power actuated means, a multi-electrode tube having input and output circuits, the output circuit being connected to the relay, a source of power being connected in series with the relay and the output circuit of the tube so that when the latter conducts the relay will be energized to close the circuit to the power actuated tuning means, a control electrode in said input circuit to said tube, conductive means upon which a voltage is developed which is proportional to the strength of the incoming signal connected to the control electrode to control conductive periods of said tube and therefore energizing periods of the relay, electrical storage means connected to the output circuit of the tube to furnish energizing power to the relay for a short predetermined time after tube deenergization by the incoming signal to provide delay after the tube has been biased to cut off, and manual means to close an energizing circuit to the relay to initiate operation of the tuning means after it has stopped on station due to a received signal.

3. In high frequency signalling apparatus having power actuated tuning means to repetitively scan the frequency band of the apparatus and stop or index due to an incoming signal, means for controlling the power actuated tuner including relay switching means connected to and controlling the power actuated means, a multi-electrode tube having input and output circuits, the output circuit being connected to the relay, a source of power being connected in series with the relay and the output circuit of the tube so that when the latter conducts the relay will be energized to close the circuit to the power actuated tuning means, a control electrode in said input circuit to said tube, conductive means upon which a voltage is developed which is proportional to the strength of the incoming signal connected to the control electrode to control conductive periods of said tube and therefore energizing periods of the relay, and a resistance and capacity means connected in the output circuit of the tube and to the electrodes thereof to furnish energizing power after the control grid has been biased to cut off to maintain the relay energized for a predetermined time period to prevent overtravel due to weak signals.

4. In high frequency signalling apparatus having power actuated tuning means to repetitively scan the frequency band of the apparatus and stop or index due to an incoming signal, means for controlling the power actuated tuner including relay switching means connected to and controlling the power actuated means, a multi-electrode tube having input and output circuits, the output circuit being connected to the relay, a source of power being connected in series with the relay and the output circuit of the tube so that when the latter conducts the relay will be energized to close the circuit to the power actuated tuning means, a control electrode in said input circuit to said tube, a second electron tube having grid and plate circuits, conductive means upon which a voltage is developed which is proportional to the strength of the incoming signal connected to the grid of the second tube, biasing means in said grid circuit to bias said second tube to cut off unless there is sufficient voltage on the conductive means to overcome said bias, a capacity resistance coupling circuit between the plate of the second tube and the grid of the first tube, and capacitor and resistor means in the output circuit of the first tube having a shorter time constant than the capacity resistance coupling between tubes to provide a short energized period after the first tube is biased to cut off to prevent overtravel.

5. In high frequency signalling apparatus having power actuated tuning means to repetitively scan the frequency band of the apparatus and stop or index due to an incoming signal, means for controlling the power actuated tuner including relay switching means connected to and controlling the power actuated means, a multi-electrode tube having input and output circuits, the output circuit being connected to the relay, a source of power being connected in series with the relay and the output circuit of the tube so that when the latter conducts the relay will be energized to close the circuit to the power actuated tuning means, a control electrode in said input circuit to said tube, a second electron tube having grid and plate circuits, conductive means upon which a voltage is developed which is proportional to the strength of the incoming signal connected to the grid of the second tube, biasing means in said grid circuit to bias said second tube to cut off unless there is sufficient voltage on the conductive means to overcome said bias, a capacity resistance coupling circuit between the plate of the second tube and the grid of the first tube, capacitor and resistor means in the output circuit of the first tube having a shorter time constant than the capacity resistance coupling between tubes to provide a short energized period after the first tube is biased to cut off to prevent overtravel and manually operated means in the relay circuit to connect the relay to the power source to cause the power actuated means to proceed on to the next station.

6. In radio receiving apparatus having power actuated means for repetitively scanning the frequency spectrum and a conductor upon which a voltage is developed which is proportional to the strength of any incoming signal, relay switching means connected to and controlling the power actuated means, a source of power, electron tube means having an input and an output circuit, said relay and source of power connected to the output circuit so that when the tube conducts the relay will close its switch to energize the power actuated means, means for connecting said conductor to said input circuit for the tube, and electrical storage means connected in said output circuit to maintain energization of the relay coil for a certain predetermined time after the tube is biased to cut off by the voltage in the conductor.

7. In radio receiving apparatus having power actuated means for repetitively scanning the frequency spectrum and a conductor upon which a voltage is developed which is proportional to the strength of any incoming signal, relay switching means connected to and controlling the power actuated means, a source of power, electron tube means having an input and an output circuit, said relay and source of power connected to the output circuit so that when the tube conducts the relay will close its switch to energize the power actuated means, means for connecting said conductor to said input circuit for the tube, and capacity and resistance means connected in the output circuit of the tube to provide a time delay discharge circuit to delay deenergization of the relay.

ANDREW G. TYNAN.
JAMES H. GUYTON.

No references cited.